United States Patent
Wang et al.

(10) Patent No.: US 9,850,571 B2
(45) Date of Patent: Dec. 26, 2017

(54) METHOD FOR PREPARING GRAPHENE

(75) Inventors: Shumin Wang, Shanghai (CN); Qian Gong, Shanghai (CN); Xiaoming Xie, Shanghai (CN); Hailong Wang, Shanghai (CN); Zengfeng Di, Shanghai (CN); Guqiao Ding, Shanghai (CN); Qingbo Liu, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 169 days.

(21) Appl. No.: 14/396,519

(22) PCT Filed: Jul. 3, 2012

(86) PCT No.: PCT/CN2012/078101
§ 371 (c)(1),
(2), (4) Date: Jan. 7, 2015

(87) PCT Pub. No.: WO2013/159453
PCT Pub. Date: Oct. 31, 2013

(65) Prior Publication Data
US 2015/0292110 A1    Oct. 15, 2015

(30) Foreign Application Priority Data
Apr. 23, 2012  (CN) .......................... 2012 1 0120753

(51) Int. Cl.
*C23C 16/26*   (2006.01)
*B82Y 30/00*   (2011.01)
(Continued)

(52) U.S. Cl.
CPC .............. *C23C 16/26* (2013.01); *B82Y 30/00* (2013.01); *B82Y 40/00* (2013.01); *C01B 32/186* (2017.08); *C01B 32/188* (2017.08)

(58) Field of Classification Search
CPC combination set(s) only.
See application file for complete search history.

(56) References Cited

U.S. PATENT DOCUMENTS

2003/0129305 A1 *  7/2003  Wu ........................ B82Y 30/00
                                                  427/255.28
2009/0246367 A1 * 10/2009  Huotari .................. B82Y 30/00
                                                  427/215
(Continued)

FOREIGN PATENT DOCUMENTS

WO    WO/2011/012874   *  2/2011  ............. B82Y 30/00

*Primary Examiner* — Duy Deo
*Assistant Examiner* — Erin Bergner
(74) *Attorney, Agent, or Firm* — Global IP Services; Tianhua Gu

(57) ABSTRACT

The invention belongs to the technical field of inorganic compounds, and particularly, relates to a method for directly preparing graphene by taking $CBr_4$ as a source material and using methods such as molecular-beam epitaxy (MBE) or chemical vapor deposition (CVD). A method for preparing graphene comprises the following steps: selecting a proper material as a substrate; directly depositing a catalyst and $CBr_4$ on a surface of the substrate; and performing annealing treatment on the sample obtained through deposition. Compared with other technologies, an innovative point of the method in the invention is that the catalyst and $CBr_4$ source can be quantitatively and controllably deposited on any substrate, and the catalyst and $CBr_4$ source react on the surface of the substrate to form the graphene, so that the dependence of the graphene growth on a substrate material can be reduced to a great extent, and different substrate (Continued)

materials can be selected according to different application backgrounds.

8 Claims, 1 Drawing Sheet

(51) Int. Cl.
    *B82Y 40/00*     (2011.01)
    *C01B 32/186*     (2017.01)
    *C01B 32/188*     (2017.01)

(56)     References Cited

U.S. PATENT DOCUMENTS

2009/0325071 A1*   12/2009   Verbrugge ............... C01B 31/04
                                                        429/219
2011/0121409 A1*   5/2011   Seo ................... H01L 21/02115
                                                        257/410

* cited by examiner

METHOD FOR PREPARING GRAPHENE

CROSS REFERENCE TO RELATED PATENT APPLICATION

The present application is the US national stage of PCT/CN2012/078101 filed on Jul. 3, 2012, which claims the priorities of the Chinese patent applications No. 201210120753.7 filed on Apr. 23, 2012, which applications are incorporated herein by reference.

FIELD OF THE INVENTION

The present invention belongs to the technical field of inorganic compounds, and particularly, relates to a method for directly preparing graphene by taking $CBr_4$ as a source material and using methods such as molecular-beam epitaxy (MBE) or chemical vapor deposition (CVD).

BACKGROUND OF THE INVENTION

Carbon (C) may be considered as the most miraculous element of nature, it becomes an integral element for constituting life on earth, and all organisms are rich in carbon. Carbon may also constitute a large amount of materials with peculiar properties, for example, it may not only constitute the known, hardest diamond, but also softer graphite. In the nano world, in addition to the formation of miraculous carbon nanotube and fullerene, in 2004, two scientists, Andre Geim and Konstantin Novoselov of Manchester University, UK, have obtained a slice composed of a layer of carbon atoms in laboratory, which is graphene. Due to the groundbreaking experiment of two-dimensional material of graphene, Andre Geim and Konstantin Novoselov won the 2010 Nobel Prize in Physics.

So far, graphene is a material that having the best electrical conductivity, in which the electron velocity reaches 1/300 of velocity of light, far exceeding the electron velocity in general conductor. Since graphene has properties of ultra-thin and super strength properties, it can be widely used in various fields, such as ultra-light body armor, ultra-thin and ultra-light aircraft materials, and the like. According to its excellent conductivity, it also has great application potential in the field of microelectronics. In the future, graphene is expected to replace traditional silicon materials, to manufacture ultra-miniature transistors, for producing future supercomputers, while higher electron mobility of carbon enables the future computers achieve higher speeds. Besides, graphene material is an excellent modifier, in the field of new energy, e.g., super-capacitors and lithium ion batteries, due to its high conductivity, high specific surface area, transparency and other characteristics; it is suitable for use as an electrode material. Graphene also can be used as ultra-thin, super-strong, transparent, flexible conductor, to substitute brittle, expensive, indium tin oxide, and is widely used in a touch screen, LCD, and a solar cell and the like. In a word, graphene has a wide application range, and its emergence is expected to lead a new round of revolution in the field of modern electronic technology.

However, the realization of the physical properties and potential applications of graphene cannot be separated from the preparation of high-quality, low-cost, large-scale graphene. Currently, the main methods for preparing graphene are: a micro-mechanical stripping method, a chemical vapor deposition method, a SiC surface graphitization method, an organic molecule dispersion method, an ion intercalation method, a solvothermal method, an oxidation-reduction method, a C-doped precipitation method, etc. In the micro-mechanical stripping method, ion beam is adopted to etch material surface, and then the material surface is stripped by mechanical force to prepare graphene. However, because of the complexity of process, the prepared graphene has low yield, which is unable to meet the demand of industrialization, to a certain extent, limits the large-scale production. Chemical vapor deposition method is a film growth method that forms a graphene thin film on a substrate surface by using a chemical reaction, and it has been reported that CO is changed into gaseous carbon atoms via its reduction by $CH_4$, and the product deposits on a substrate surface, to form two-dimensional graphene films. Since $CH_4$ has high decomposition temperature, this method is only suitable for a small number of substrate materials resistant to high temperature. SiC surface graphitization method is that, under ultrahigh vacuum, 4H—SiC or 6H—SiC was heated above 1300° C., then Si atoms on the SiC crystal surface are evaporated and a reconstruction of carbon atoms occur, so that two-dimensional graphene films are formed on the surface of Si single crystal. The thickness of the graphene films prepared by such method is only 1 to 2 carbon atoms layer, with high carrier mobility. But the graphene prepared by using such method fails to observe quantum Hall effect, and the electronic properties of graphene surface greatly affected by the SiC substrate, and further research is still in progress. In the organic molecule dispersion method, graphite is ultrasonic dispersion in organic solvent to obtain the graphene, and the graphene prepared by such method has fewer defects, but the concentration is not high. In the ion intercalation method, firstly graphite intercalation compounds are prepared, and then graphene is dispersed and prepared in an organic solvent; while the graphene prepared by such method has lower dispersion. In the solvothermal method, reactant is added into a solvent, and by taking the property that above the critical temperature and critical pressure, the solvent enables to dissolve the vast majority of substances, the reaction that cannot occur under normal conditions enables to occur at lower temperatures (at a high pressure) or to be accelerated. This method features short development time; while many theoretical and technical issues at this stage still cannot break through yet, and should be further explored. In the oxidation-reduction method, graphite is oxidized to obtain oxidized graphene dispersed in a solution, which is further reduced by a reducing agent to prepare graphene; it has low cost, high yield, but the graphite completely oxidized by a strong oxidant is hard to be completely restored, resulting in loss of some physical and chemical properties, especially the loss of conductivity. In the C-doped precipitated method, MBE is used to grow C-doped GaAs material, which is further decomposed by raising the temperature, therein the C atom is precipitated to form graphene; this method has low controllability, and the generated graphene has a relatively low quality, and is still on the groping stage. It is requisite to improve the existing level of preparation method, and currently, the preparation of graphene is still a technical problem in this field.

The convenient method of this invention, by taking $CBr_4$ as a source material, for directly preparing graphene, may prepare a continuous, large-area graphene film material on many substrates, and the existing semiconductor process techniques may perform tailoring modification on the graphene film material, such that the graphene materials prepared by such method has great application potential in microelectronics and optoelectronics fields.

SUMMARY OF THE INVENTION

The present invention provides a new and convenient method for the preparation of graphene. In this method, by taking $CBr_4$ as a source material and using methods such as molecular-beam epitaxy (MBE) or chemical vapor deposition (CVD), a large-sized graphene is grown directly on a single crystal or an amorphous substrate, and graphene devices can be prepared at lower temperature without a transfer after growth. The invention has important significance in the practical applications of graphene.

The method mainly comprises three steps: selecting a proper material as a substrate; rising the temperature of substrate to a proper temperature to deposit a suitable amount of $CBr_4$, and a proper catalyst may be selected during the process; subsequent processing is performed as required after the growth of sample, such as annealing treatment with a proper temperature, and the like.

The present invention provides a method for directly preparing graphene on substrate material, by taking $CBr_4$ as a source material. The specific steps of the method for preparing graphene are that:

A method for preparing graphene, comprising the following steps:
1) selecting a proper material as a substrate;
2) directly depositing $CBr_4$ on a surface of the substrate;
3) performing annealing treatment on the sample obtained by step 2.

Preferably, in step 2, the surface of the substrate is further directly deposited with a catalyst.

Preferably, the deposition manner for $CBr_4$ and catalyst is synchronous deposition, successively deposition in any order, or alternatively deposition in any order more than once. In the various deposition manner, the total deposition of $CBr_4$ is 3.8E7-3.8E9 molecules/$\mu m^2$, and the total deposition of catalyst is 1.7E7-1.7E9 atoms/$\mu m^2$.

Preferably, the method for depositing the $CBr_4$ and catalyst is molecular-beam epitaxy (MBE) or chemical vapor deposition (CVD).

More preferably, the method for depositing the $CBr_4$ and catalyst is molecular-beam epitaxy (MBE).

Preferably, deposition temperature for the $CBr_4$ and catalyst is between 10° C. and 600° C.

Preferably, the catalyst is selected from Ga.

Preferably, the catalyst is Ga, during deposition, temperature of Ga furnace is between 800° C. and 1200° C., and the pressure of $CBr_4$ is between 0.08 Torr and 0.15 Torr.

Preferably, the substrate material is selected from metal, semiconductor, or insulator.

Preferably, the substrate material is selected from silicon, germanium, silicon oxide, and sapphire, and the like.

Preferably, after step (2) is completed, the sample needs to perform annealing treatment.

Preferably, the method for annealing treatment is that: the substrate is slowly raised to 600-750° C. at a rate of 0.1-1.0° C./s for annealing, with the annealing time of 5-180 minutes; when completed, the temperature of the substrate is decreased to room temperature.

Preferably, deoxidize temperature of the substrate material is 400-700° C., temperature of the annealing treatment of the substrate material is 600-750° C.

By comparing the sample after annealing treatment with the sample before annealing treatment, the positions of the G peak and D peak of the sample have slight offsets, the spectral characteristic becomes obvious better, with the intensity enhancing more than 10 times, as well as the appearance of 2D peak. Raman peak at 2678 $cm^{-1}$ ought to be the 2D peak of the epitaxial graphene (see FIG. 2).

The obtained graphene prepared by the provided convenient method for preparing graphene of the present invention is single layer or multi-layer graphene. Once the growth of graphene is completed, the graphene devices can be obtained without a transfer, so that it is convenience for use, and has wider applicability and broader application prospects.

Compared to other technologies, an innovative point of the method in the present invention is that the catalyst and $CBr_4$ source can be quantitatively and controllably deposited on any substrate, and the catalyst and the $CBr_4$ source react on the surface of the substrate to form the graphene, so that the dependence of the graphene growth on a substrate material can be reduced to a great extent, and different substrate materials can be selected according to different application backgrounds. In addition, the present invention also has the following advantages: 1) MBE or CVD is used to accurately control the amount of the catalyst and $CBr_4$, which is beneficial for controlling the mass and layers of the graphene. 2) MBE or CVD can ensure a uniformly deposition of material on a large-sized substrate, which is beneficial for the formation of graphene material with uniformly distributed of mass on a large-sized substrate. 3) Due to the unique chemical properties of $CBr_4$, this method enables to grow graphene material at lower temperatures; such advantage may very effectively broaden the selectivity of the substrate material by combining with the above innovative point. 4) In the semiconductor industry, MBE and CVD techniques have been widely used in the materials of epitaxial microelectronic and optoelectronic devices, while the present invention provides a method for directly monolithic integration of graphene and microelectronic and optoelectronic devices.

DETAILED DESCRIPTION OF THE PREFERRED EMBODIMENTS

Embodiment 1

Figure 1:
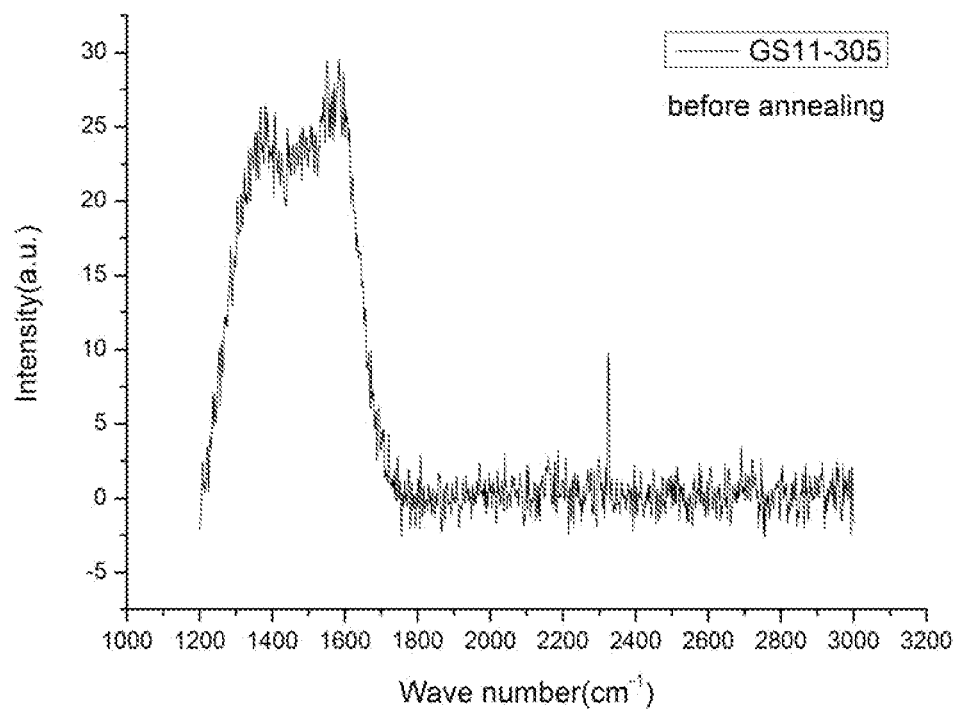
FIG. 1 is a roman spectrum of a sample before an annealing treatment, in which no obvious 2D peak can be observed.

The object of the present invention is to provide a convenient method for directly preparing graphene by taking $CBr_4$ as a source material.

In order to further elaborate the present method, herein, we illustrate a specific process for preparing graphene by taking semiconductor Ge as a substrate and using molecular beam epitaxial technique.

In the experiment, Oxford Instruments V90 gas source molecular beam epitaxy (GSMBE) system is adopted, wherein the V90 may not only be used as the experimental instrument, but also be used as an equipment for small-scale production. It enables to epitaxial grow one piece of substrate of 4 inches, or one piece of substrate of 3 inches, or three pieces of substrate of 2 inches at one time, and in addition to manual operation, the automatic operation is allowable as well.

In the experiment, we choose semiconductor Ge (2° offset) as a substrate, the temperature of which is further raised from 150° C. to 680° C. at a rate of 0.5° C./s by a heater. Around 455° C., it is observed that the oxides on the substrate are rapidly removed. Keep the substrate at the temperature of 680° C. to perform annealing for 20 minutes, and once the annealing is completed, the temperature of the substrate is cooled down to 450° C. to perform the growth of graphene sample; for growth, the temperature of the Ga furnace is raised to 1015° C., while the pressure of $CBr_4$ is adjusted to $PCBr_4$=0.12 Torr. During the growth process, firstly, Ga is deposited for 80 seconds, with a deposition of 1.7E8 atoms/$\mu m^2$; then turn on a $CBr_4$ valve, with a deposition of 3.8E7 molecules/$\mu m^2$, turn off the $CBr_4$ valve after 20 minutes; the above process was repeated 10 times. After that, the temperature of the substrate is raised to 720° C. at a rate of 0.8° C./s to perform annealing, and the total time from the beginning of heating to the end of annealing so that start to cool, is 16 minutes. After annealing, the temperature of the substrate is cooled down to finish the growth.

After the sample growth is completed, the sample is annealed. Then, the samples before and after annealing were detected by Raman spectra. Raman spectra is carried out by a DXR type Raman spectroscopy produced by Thermal Scientific Company, which adopts a laser of 532 nm to excite, a scanned range of 1000-3000 $cm^{-1}$, and a wave number resolution of 1 $cm^{-1}$.

Raman spectra is a kind of scattering spectrum. Raman spectroscopy is based on the Raman scattering found by the Indian scientist Raman, and is an analytical method applied in the investigation of molecular structure by the analyze of scattering spectra that having different frequency with the incident light, so as to obtain the information of vibration and rotation of molecules. The application of Raman spectra for characterizing graphene allows the numbers of layers of the graphene to be determined more precisely. The shape of the Raman spectra (including peak position and peak stretch) is mainly determined by the number of layers and mass of the graphene, thus the number of layers and mass of the graphene can be nondestructive characterized with high efficiency by using Raman spectra. The shape, width and position of the Raman spectra are related to its numbers of layers, so that it provides a high efficiency, nondestructive characterization method to measure the numbers of layers of a graphene. Both G peak (~1580 $cm^{-1}$) and 2D peak (~2700 $cm^{-1}$) are characteristic peaks of graphene, such that the general number of layers of graphene may be determined by the intensity ratio of D peak and G peak. D peak (~1350 $cm^{-1}$) accompanies with a variety of defects.

Raman spectral measurement of the unannealed graphene is shown in FIG. 1. As can be seen from FIG. 1, there are two obvious absorption peaks, i.e., an absorption peak (G peak) at 1586 $cm^{-1}$ and an absorption peak (D peak) at 1373 $cm^{-1}$, with low signal-to-noise ratio and weaker signal strength.

Figure 2:
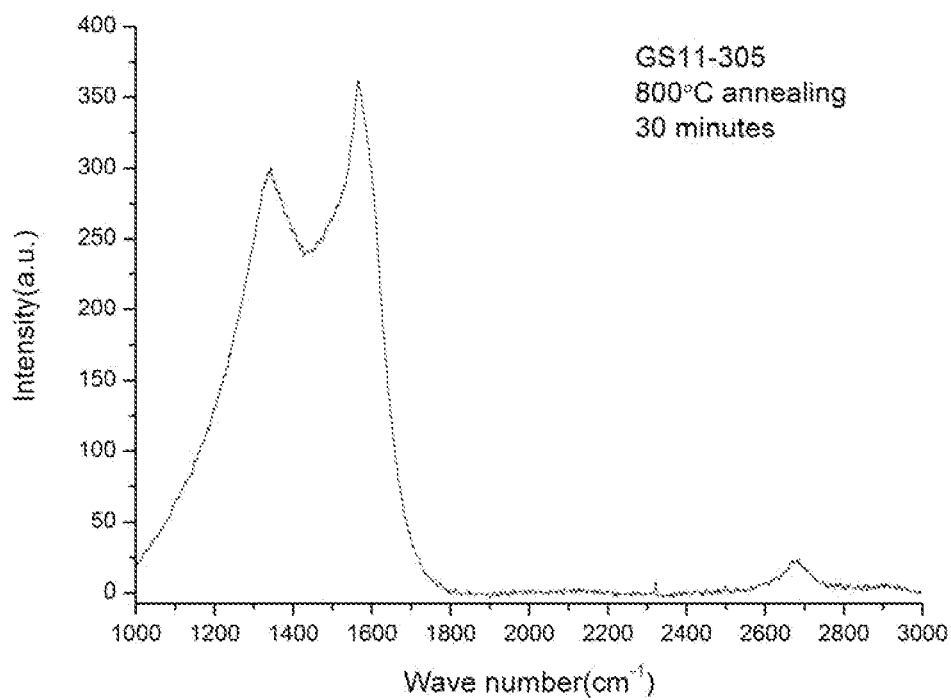
FIG. 2 is a roman spectrum of a sample 30 minutes after an annealing treatment at 800° C., in which 2D peak can be obviously observed, indicating the existence of graphene.

The temperature of the grown sample is raised to 800° C. to perform annealing for 30 minutes, and the Raman spectra of the sample after annealing is shown in FIG. 2. As can be seen from FIG. 2, there are three obvious absorption peaks, i.e., an absorption peak (G peak) at 1565 $cm^{-1}$, an absorption peak (D peak) at 1338 $cm^{-1}$, and an absorption peak at 2678 $cm^{-1}$. When compared to the sample before annealing, the sample after annealing shows a slight offset for both G peak and D peak, as well as an obvious better spectral characteristic, and a ten times increasing of intensity, and an appearance of 2D peak. The Raman peak at 2678 $cm^{-1}$ ought to be the 2D peak of the epitaxial graphene, indicating that the inventors have successfully obtained graphene samples.

The inventors have illustrated the experimental results that graphene has been successfully prepared by taking a semiconductor Ge as a substrate and using molecular beam epitaxy technique, which proves the feasibility of the method of the present invention; further optimize experimental parameters and post-treatment process are expected to achieve high-quality graphene films. Certainly, the method can be extended to other metal, semiconductor or insulator substrates, such as silicon, germanium, silicon oxide, sapphire and the like.

What is claimed is:

1. A method for preparing graphene, comprising the following steps:
   (1) selecting a proper material as a substrate;
   (2) directly depositing $CBr_4$ and catalys on a surface of the substrate, the catalyst is Ga, the deposition manner for $CBr_4$ and catalyst is alternatively deposition in any order more than once, in each deposition manner, the total deposition of $CBr_4$ is 3.8E7-3.8E9 molecules/$\mu m^2$, the total deposition of catalyst is 1.7E7-1.7E9 atoms/$m^2$, and a deposition temperature for the $CBr_4$ and catalyst is between 10° C. and 490° C.;
   (3) performing annealing treatment on the sample obtained by step 2 to obtain the graphene.

2. The method for preparing graphene according to claim 1, characterized in that, the method for depositing the $CBr_4$ and catalyst is molecular-beam epitaxy or chemical vapor deposition.

3. The method for preparing graphene according to claim 1, characterized in that, the substrate material is selected from metal, semiconductor, or insulator.

4. The method for preparing graphene according to claim 3, characterized in that, the substrate material is selected from silicon, germanium, silicon oxide, and sapphire.

5. The method for preparing graphene according to claim 1, characterized in that, the method for annealing treatment is that: the substrate is raised to 650-720° C., and the annealing time is 5-180 minutes; when completed, the temperature of the substrate is decreased to room temperature.

6. The method for preparing graphene according to claim 1, characterized in that, before step (1), the substrate further requires for a deoxygenation treatment and a pre-annealing treatment.

7. The method for preparing graphene according to claim 6, characterized in that, deoxidize temperature of the substrate material in the deoxygenation treatment is 400-700° C., temperature of the annealing treatment of the substrate material is 600-750° C.

8. A method for preparing graphene according to claim 1, characterized in that, in step (2) the deposition temperature for the $CBr_4$ and catalyst is 450° C.

* * * * *